(12) United States Patent
Leem

(10) Patent No.: US 9,129,682 B2
(45) Date of Patent: Sep. 8, 2015

(54) SEMICONDUCTOR MEMORY DEVICE AND METHOD OF OPERATING THE SAME

(75) Inventor: Jong Soon Leem, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 242 days.

(21) Appl. No.: 13/601,181

(22) Filed: Aug. 31, 2012

(65) Prior Publication Data

US 2013/0155772 A1    Jun. 20, 2013

(30) Foreign Application Priority Data

Dec. 20, 2011    (KR) .......................... 10-2011-0138203

(51) Int. Cl.
*G11C 16/10* (2006.01)
*G11C 16/12* (2006.01)
*G11C 16/24* (2006.01)

(52) U.S. Cl.
CPC ................ *G11C 16/10* (2013.01); *G11C 16/12* (2013.01); *G11C 16/24* (2013.01)

(58) Field of Classification Search
CPC ......... G11C 16/10; G11C 16/24; G11C 16/12
USPC .............. 365/185.02, 185.11, 185.18, 185.23
See application file for complete search history.

(56) References Cited

U.S. PATENT DOCUMENTS

| 5,789,776 | A  | * | 8/1998 | Lancaster et al. ............. 257/296 |
| 6,680,685 | B2 | * | 1/2004 | Nozaki ......................... 341/158 |
| 6,751,133 | B2 | * | 6/2004 | Kurosaki ................. 365/189.11 |
| 2008/0316830 | A1 | * | 12/2008 | Yang et al. ............... 365/185.18 |
| 2010/0020618 | A1 | * | 1/2010 | Kim et al. ................ 365/185.23 |
| 2010/0124124 | A1 | * | 5/2010 | Lee et al. ................. 365/185.19 |

* cited by examiner

*Primary Examiner* — Douglas King
(74) *Attorney, Agent, or Firm* — IP & T Group LLP

(57) ABSTRACT

In a semiconductor memory device and a method of operating the same, a memory block including memory cells is divided into memory groups. A level of bit line voltage applied to a bit line coupled to the memory cells included in each of the memory groups varies according to a distance between a row decoder and each memory groups during a program operation. Characteristics of the threshold voltage distribution of the memory cells in the semiconductor memory device may be improved without deteriorating performance of the program.

12 Claims, 5 Drawing Sheets

SEMICONDUCTOR MEMORY DEVICE AND METHOD OF OPERATING THE SAME

CROSS-REFERENCE TO RELATED APPLICATION

This application claims priority from Korean Patent Application No. 10-2011-0138203, filed on Dec. 20, 2011, the contents of which are incorporated herein by reference in its entirety.

BACKGROUND MODE OF THE INVENTION

The present invention relates to a semiconductor memory device and a method of operating the same; and particularly relates to a semiconductor memory device capable of improving characteristics of threshold voltage distribution of memory cells and a method of operating the same.

Recently, the number of memory cells connected to one word line has increased according to enhanced reliability of a semiconductor memory device such as flash memory devices. Length and load of the word line increase as the number of the memory cells increases.

A row decoder may supply a voltage to the word line during a program operation. However, a program voltage level applied to a control gate of a memory cell, which is close to the row decoder, is different from that applied to another control gate of a memory cell, which is far from the row decoder, as the load of the word line increases.

Furthermore, because of different program voltage levels, increased level of a threshold voltage in the memory cell which is near the row decoder is different from that of a threshold voltage of the memory cell which is far from the row decoder. Accordingly, threshold voltage distribution of the memory cells becomes wide.

The wide distribution of threshold voltage may deteriorate performance of program, because the time required for a program operation becomes long when an additional program pulse is applied to the word line so as to increase the threshold voltage of the memory cell which is far from the row decoder. A method of improving the threshold voltage distribution of the memory cells without deteriorating performance of the program operation has been required.

SUMMARY OF THE INVENTION

Exemplary embodiments of the present invention a semiconductor memory device for applying voltages having different levels, according to the distance between a row decoder and a memory cell, into a bit line coupled to the memory cell during a program operation, in order to enhance characteristics of threshold voltage distribution of the memory cell without deteriorating performance of the program, and a method of operating the same.

A semiconductor memory device according to a first embodiment of the present invention includes a memory block having memory groups, each including cell strings coupled to word lines; a row decoder configured to apply a program voltage to a selected word line during a program operation; and a bit line voltage supply circuit configured to apply a bit line voltage into a bit line coupled to a program target cell determined according to input data among memory cells coupled to the selected word line, wherein a level of the bit line voltage varies according to a distance between the row decoder and the memory group including the program target cell.

A semiconductor memory device according to a second embodiment of the present invention includes a memory block having memory groups, each including cell strings coupled to word lines; a row decoder configured to apply a program voltage to a selected word line among the word lines during a program operation; page buffer groups including page buffers for applying a reference voltage to a bit line coupled to a program target cell determined according to input data among memory cells coupled to the selected word line; and a reference voltage supply circuit configured to provide the reference voltage to the page buffer groups corresponding to the memory groups, wherein a level of the reference voltage varies according to a distance between the row decoder and the memory group including the program target cell.

A method of operating a semiconductor memory device according to one embodiment of the present invention includes applying a first voltage to a bit line coupled to a program target cell among first memory cells coupled to a selected word line in a first memory group; applying a second voltage, different from the first voltage, to a bit line coupled to another program target cell among second memory cells coupled to the selected word line in a second memory group; and performing a program operation of storing data in the first and the second memory cells by providing a program voltage to the selected word line and applying a pass voltage to other word lines.

In a semiconductor memory device and a method of operating the same of the present invention, a memory block including memory cells is divided into plural memory groups. A bit line voltage applied to a bit line coupled electrically to the memory cells included in each of the memory groups varies according to distance between a row decoder and each memory group in a program operation. As a result, the threshold voltage distribution of the memory cells may be narrower without deteriorating performance of the program.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
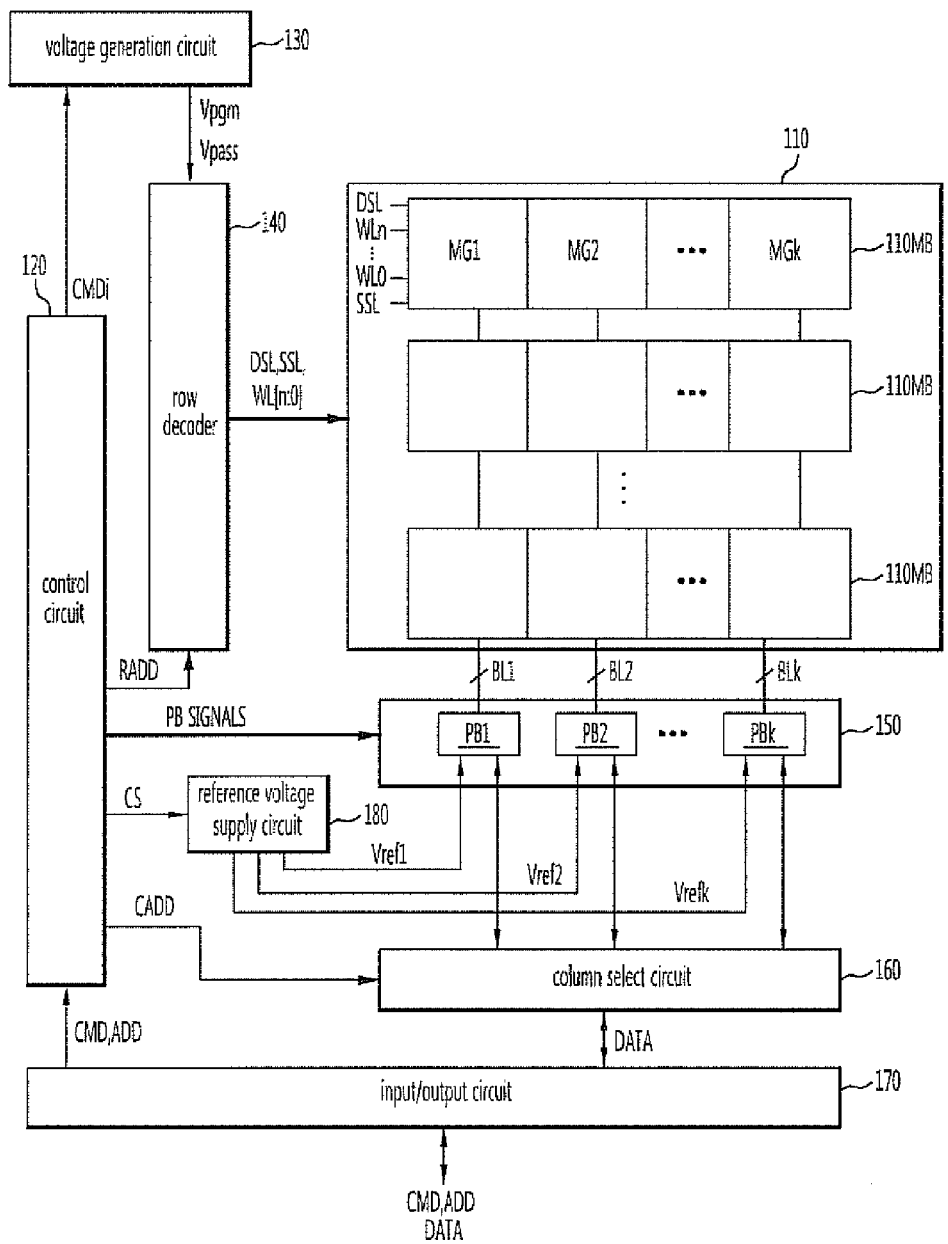
FIG. 1 is a view illustrating circuitry of a semiconductor memory device according to one exemplary embodiment of the present invention.
Figure 2:
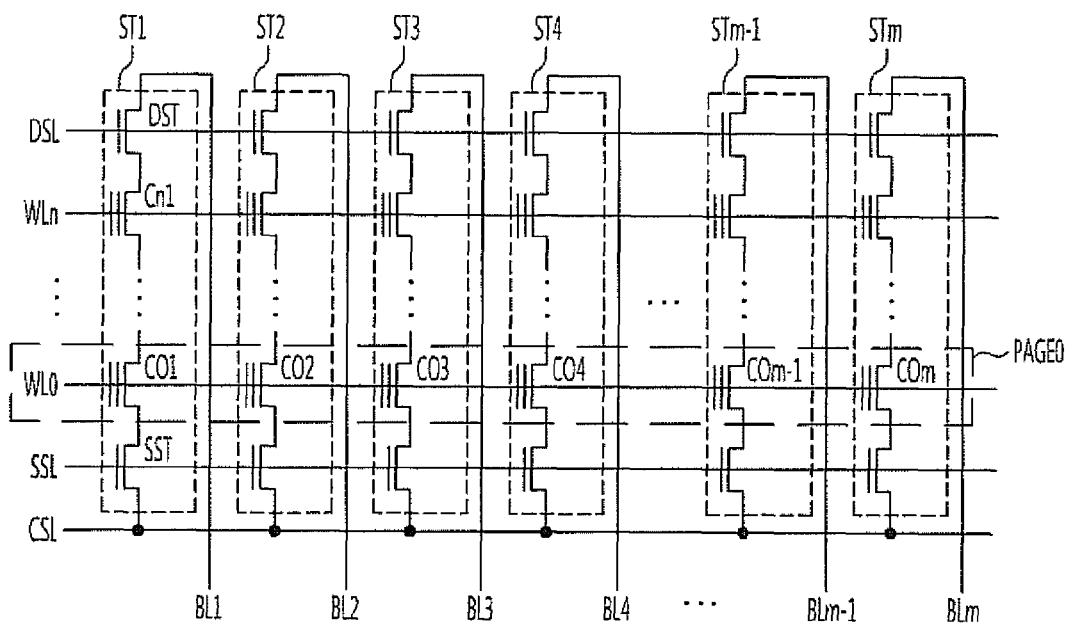
FIG. 2 is a view illustrating circuitry of a memory group in FIG. 1.

FIG. 1 illustrates a circuitry of a semiconductor memory device according to an exemplary embodiment of the present invention. FIG. 2 illustrates a circuitry of a memory group in FIG. 1.

The semiconductor memory device includes a memory array 110 having memory blocks 110MB split into plural memory groups MG1 to MGk, operation circuits 130, 140, 150, 160, 170 and 180 for performing a program operation of memory cells in a selected page of the memory block 110MB, and a control circuit for controlling the operation circuits 130, 140, 150, 160, 170 and 180. In a case when the semiconductor memory device is a NAND flash memory device, the operation circuits may include a voltage supply circuit, a page buffer group 150, a column select circuit 160, an input/output circuit 170, and a reference voltage supply circuit 180.

The memory array 110 includes the memory blocks 110MB. Each of the memory blocks is split into the plural memory groups MG1 to MGk.

In FIG. 2, a memory group MG1 includes strings ST1 to STm connected between bit lines BL1 to BLm and a common source line CSL. That is, the strings ST1 to STm are respectively connected to the bit line BL1 to BLm and are connected in common to the common source line CSL. Each of the strings ST1 to STm has a source select transistor SST connected to the common source line CSL, memory cells C01 to Cn1, and a drain select transistor DST of which a drain is connected to the bit line BL1. The memory cells C01 to Cn1 are connected in serial between the source select transistor SST and the drain select transistor DST. A gate of the source select transistor SST is connected to a source select line SSL. Gates of the memory cells C01 to Cn1 are respectively connected to word lines WL0 to WLn. A gate of the drain select transistor DST is connected to a drain select line DSL.

Memory cells included in a memory block in the NAND flash memory device may be divided into physical pages or logical pages. For example, memory cells connected to one word line, e.g., WL0, may form a physical page PAGE0. Memory cells in an order of even number connected to one word line, e.g., WL0, may form one even physical page, while memory cells in an order of odd number may form one odd physical page. The page (even page or odd page) is a unit for the program operation or the read operation. Hereinafter, it is assumed that the memory cells connected to one word line constitute one logical page.

Referring to FIGS. 1 and 2, the control circuit 120 outputs an internal command signal CMDi for performing the program operation in response to a command signal CMD inputted from outside through the input/output circuit 170. Also, the control circuit 120 outputs PB control signals PB_SIGNALS for controlling page buffer groups 150 (PB1 to PBk) according to operations. An operation of the control circuit 120 for controlling the page buffers PB1 to PBk will be described below. The control circuit 120 outputs a row address signal RADD and a column address signal CADD in response to an address signal ADD inputted from outside through the input/output circuit 170.

The voltage supply circuit provides operation voltage, e.g., Vpgm and Vpass, required for the program operation of the memory cells, into local lines, which includes the drain select line DSL, the word lines WL0 to WLn, and the source select line SSL, in response to the internal command signal CMDi of the control circuit 120. Herein, the voltage supply circuit includes a voltage generation circuit 130 and a row decoder 140.

The voltage generation circuit 130 outputs the operation voltage, e.g., Vpgm and Vpass, required for the program operation of the memory cells to global lines in response to the internal command signal CMDi of the control circuit 120. During the program operation, the voltage generation circuit 130 outputs a program voltage Vpgm and a pass voltage Vpass into the global lines. Herein, the program voltage Vpgm is applied to memory cells in a selected page, while the pass voltage Vpass is applied to memory cells in an unselected page.

The row decoder 140 connects the global lines to the local lines DSL, WL0 to WLn, and SSL so that the operation voltages outputted from the voltage generation circuit 130 are delivered into selected local lines DSL, WL0 to WLn, and SSL of the memory block 110MB in the memory array 110 in response to the row address signals RADD of the control circuit 120. As a result, the program voltage Vpgm is applied to local word line, e.g., WL0, connected to a selected memory cell, e.g., C01, from the voltage generation circuit 130 through global word line. The pass voltage Vpass is provided to local word lines, e.g., WL1 to WLn, connected to unselected memory cells C11 to Cn1 from the voltage generation circuit 130 through global word lines. Accordingly, data in the selected memory cell C01 is stored by the program voltage Vpgm.

The page buffer groups PB1 to PBk are connected to each of the memory groups MG1 to MGk through the bit line groups BL1 to BLk. Each of the page buffer groups PB1 to PBk includes plural page buffers. Each page buffers precharges selectively the bit lines BL1 to BLm according to data inputted for storing data in the memory cells C01 to C0m in response to the PB control signal PB_SIGNALS. Otherwise, each page buffer senses voltages of the bit lines BL1 to BLm to read data from the memory cells C01 to C0m.

Constitution of the page buffer will be described below.

The column select circuit 160 selects the page buffers included in the page buffer group PB1 to PBk in response to the column address signal CADD outputted from the control circuit 120. That is, the column select circuit 160 delivers in sequence data to be stored in the memory cells to the page buffers in response to the column address signal CADD.

The input/output circuit 170 delivers data to the column select circuit 160 according to control of the control circuit 120, to input the data inputted from outside for storing the data in the memory cells to the page buffer group PB1 to PBk in the program operation. In a case when the column select circuit 160 delivers the data provided from the input/output circuit 170 to the page buffers in the page buffer groups PB1 to PBk according to above mentioned method, the page buffers store the delivered data in an internal latch circuit.

The reference voltage supply circuit 180 provides reference voltages Vref1 to Vrefk having different magnitude to each of the page buffer groups PB1 to PBk in response to a control signal CS of the control circuit 120. The reference voltage supply circuit 180 may provide the reference voltage having higher magnitude to the page buffer group connected to corresponding memory group according as the distance between the memory group and the row decoder 140 is short. That is, the reference current supply circuit 180 may provide a first reference voltage Vref1 having the highest magnitude to a first page buffer group PB1. The reference current supply circuit 180 may apply a kth reference voltage Vrefk having the smallest magnitude to a kth page buffer group PBk. In another embodiment of the present invention, the reference voltage supply circuit 180 may set the kth reference voltage Vrefk to a voltage for discharging the bit line, e.g., 0V. The reference voltage supply circuit 180 may provide the set kth reference voltage Vrefk to the kth page buffer group PBk. The reference voltage supply circuit 180 may apply the first reference voltage Vref1 having the highest voltage by increasing the reference voltage to the first page buffer group PB1 step-by-step.

For example, in a case where the memory block is divided into four memory groups, the four memory groups may be defined as first to fourth memory groups according to corresponding distances from the row decoder 140. Here, the reference voltage supply circuit 180 may apply a bit line discharge voltage (e.g. 0V) as a fourth reference voltage to a fourth page buffer group connected to the fourth memory group. The reference voltage supply circuit 180 may provide a voltage of 0.1V as a third reference voltage to a third page buffer group connected to the third memory group. The reference voltage supply circuit 180 may apply a voltage of 0.15V as a second reference voltage to a second page buffer group connected to the second memory group. The reference voltage supply circuit 180 may provide a voltage of 0.2V as a first reference voltage to a first page buffer group connected to the first memory group. In still another embodiment of the present invention, the reference voltage supply circuit 180 may apply a negative voltage, not a positive voltage, to each of the page buffer group when it applies corresponding reference voltage to each of the page buffer group. The shorter distance between the row decoder 140 and corresponding memory group is, the smaller the negative voltage having absolute value is applied to the page buffer group connected to corresponding memory group. The above embodiments describe the operation with reference to the row decoder 140. However, the present invention is not limited as the row decoder 140 and may use every element capable of applying program voltage to selected word line in the program operation. Furthermore, the row decoder 140 locates beside the memory block in the above embodiments, but it may locate at a center of the memory array. In this case, the memory array is embodied with mirror structure around the row decoder 140.

Figure 3:
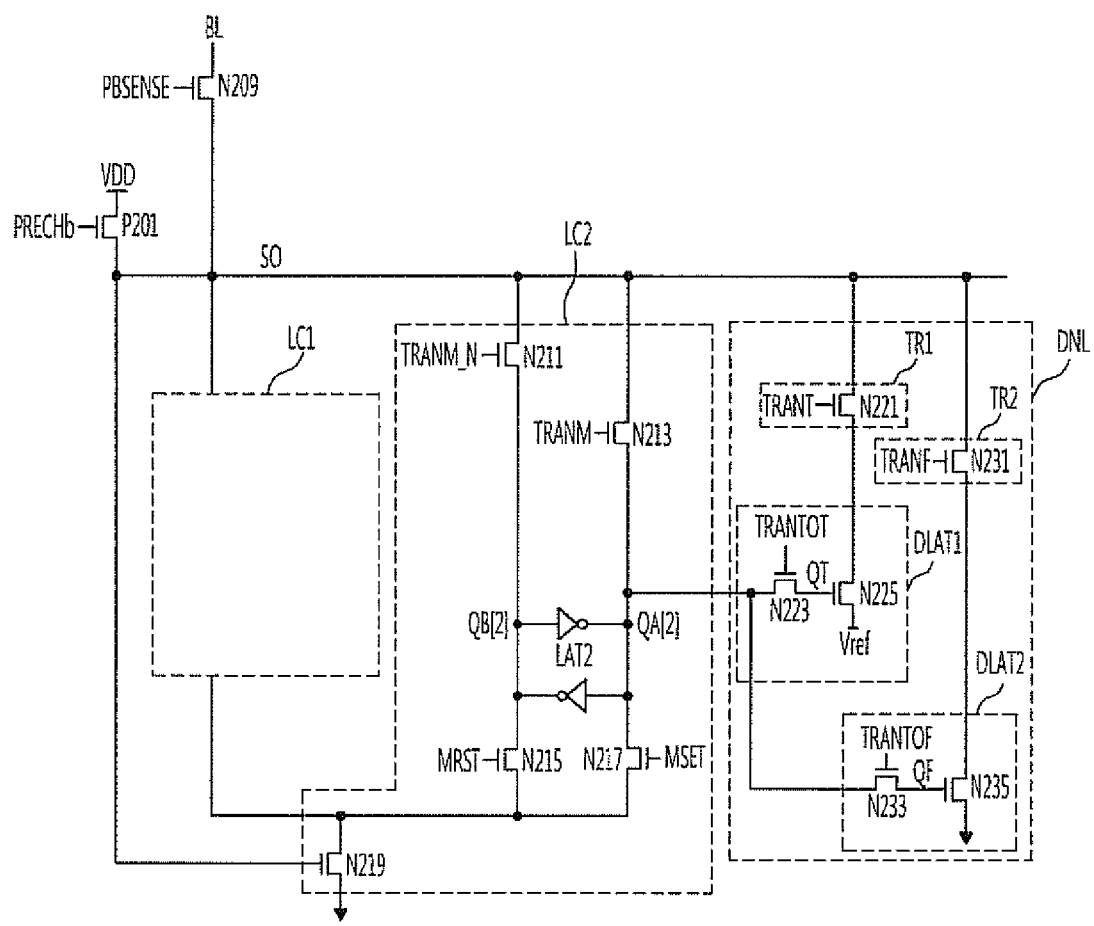
FIG. 3 is a view illustrating a page buffer in a page buffer group in FIG. 1.

FIG. 3 is a view illustrating a page buffer in a page buffer group in FIG. 1.

In FIG. 3, the page buffer operates according to a control circuit (120 in FIG. 1). Signals PRECHb, TRANM, TRANM_N, MRST, MSFT, TRANTOT, TRANT, TRANTOF, TRANF, and PBSENSE described below may be outputted from the control circuit.

The page buffer includes a bit line connection circuit N209, a precharge circuit P201, and latch circuits LC1, LC2, and DNL.

The bit line connection circuit N209 connects a bit line BL to one of the latch circuits LC1, LC2, and DNL in response to a connection signal PBSENSE. The latch circuits LC1, LC2 and DNL are connected in parallel to the bit line connection circuit N209. A node between the bit line connection circuit N209 and the latch circuits LC1, LC2, and DNL is a sensing node SO.

The precharge circuit P201 precharges the sensing node SO in response to a precharge signal PRECHb.

The number of the latch circuits LC1, LC2, and DNL may be modified according to design. It is assumed that the latch circuits include the two latch circuits LC1 and LC2 and the dynamic latch DNL. The first latch circuit LC1 may store temporarily data inputted from the column select circuit 160 and deliver the stored data to the second latch circuit LC2. Otherwise, the first latch circuit LC1 store temporarily data read from the memory cell according to a read operation and output the stored data to the column select circuit 160. The second latch circuit LC2 may apply a program inhibition voltage or a program allowable voltage to a bit line according to the data delivered from the first latch circuit LC1, when the program operation is performed. The second latch circuit LC2 may store temporarily data in the memory cell in response to a voltage of the bit line in the read operation. The second latch circuit LC2 may deliver the stored data to the first latch circuit LC1.

The latch circuits include switching elements and a latch. Constitution of the latch circuits will be described through the second latch circuit LC2 and the dynamic latch DNL.

The latch circuit LC2 includes a latch LAT2, a switching element N213, a switching element N211, switching elements N217 and N215, and a switching element N219. The latch LAT2 is for latching data. The switching element N213 connects a first node QA[2] of the latch LAT2 to the sensing node SO in response to a transmission signal TRANM. The switching element N211 connects a second node QB[2] of the latch LAT2 to the sensing node SO in response to an inverse transmission signal TRANM_N. The switching elements N217 and N215, connected to each of the first node (non-inverse terminal, QA[2]) and the second node (inverse terminal, QB[2]), is for operating in response to a set signal MSET and a reset signal MRST. The switching element N219, connected between the switching elements N217 and N215 and a ground terminal, is for operating according to the voltage of the sensing node SO.

In a case when signals having different waveform are inputted to the latch circuit LC1, only one latch circuit may be activated or the latch circuit LC1 may have different function from the latch circuit LC2 though the latch circuit LC1 has the same constitution as the latch circuit LC2.

The dynamic latch DNL includes first and second latches DLAT1 and DLAT2 for storing data, and first and second latch data transmission circuits TR1 and TR2 for delivering data stored in the latch to the sensing node SO. The first and second latches DLAT1 and DLAT2 are connected in common to the first node QA[2] of the latch LAT2 included in the second latch circuit LC2. The first and second latches DLAT1 and DLAT2 include switching elements N223 and N233 for delivering data of the first node QA[2] to latch nodes QT and QF. The switching elements N223 and N233 operate in response to a first latch input signal TRANTOT and a second latch input signal TRANTOF. The first and second latches DLAT1 and DLAT2 include switching elements N225 and N235 operating according to a potential of the latch node QT and QF. One terminal of the switching element N225 is connected to a reference voltage terminal. In a case when a potential of the latch node QT has high level, the reference voltage Vref is delivered. One of the switching elements N225 and N235 is connected to a ground terminal. Accordingly, a floating state is maintained when a potential of the latch node QF has low level. A potential having low level is delivered to the second latch data transmission circuit TR2 when the potential of the latch node QF has high level. The first and the second latch data transmission circuits TR1 and TR2 connect the first and second latches DLAT1 and DLAT2 to the sensing node in response to the first and second latch data transmission signals TRANT and TRANF.

In an embodiment of the present invention, the reference voltage provided from the reference voltage supply circuit (180 in FIG. 1) is inputted to the first latch DLAT1. That is, the first latch DLAT1 is used as a reference voltage delivering circuit.

Figure 4:
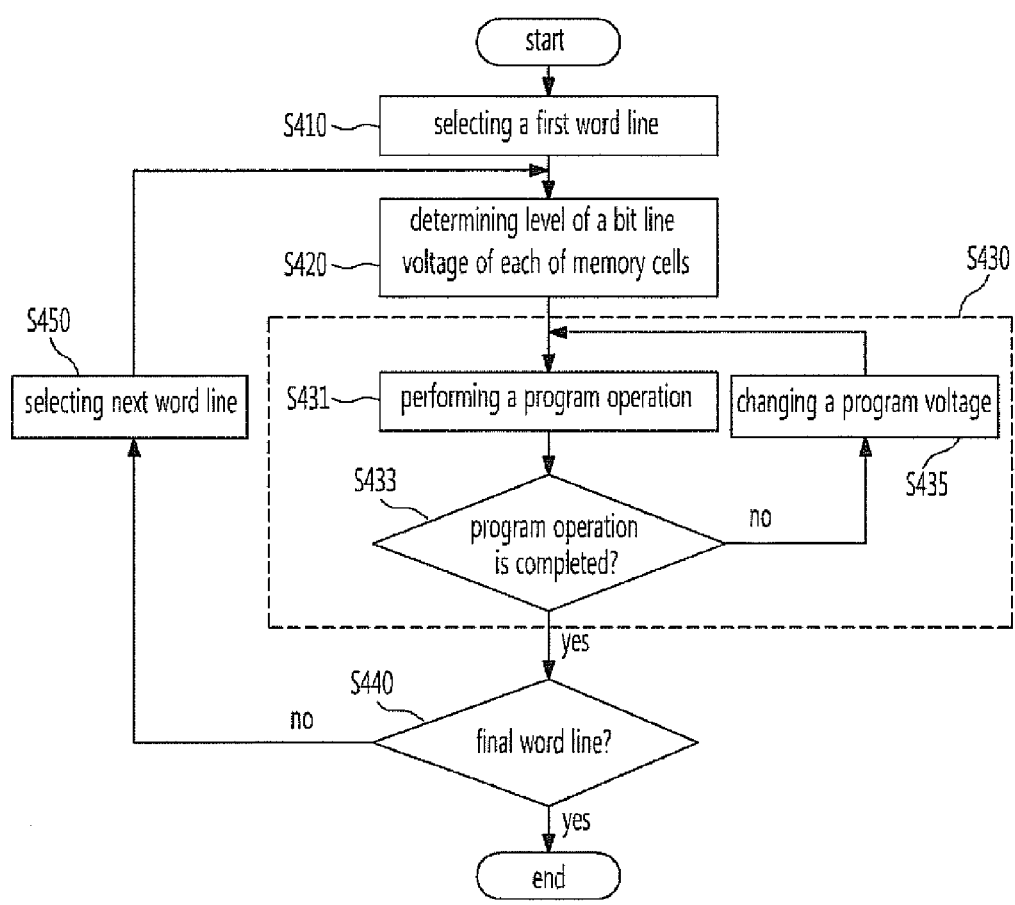
FIG. 4 and FIG. 5 are flowcharts illustrating operation of a semiconductor memory device according to one exemplary embodiment of the present invention.
Figure 5:
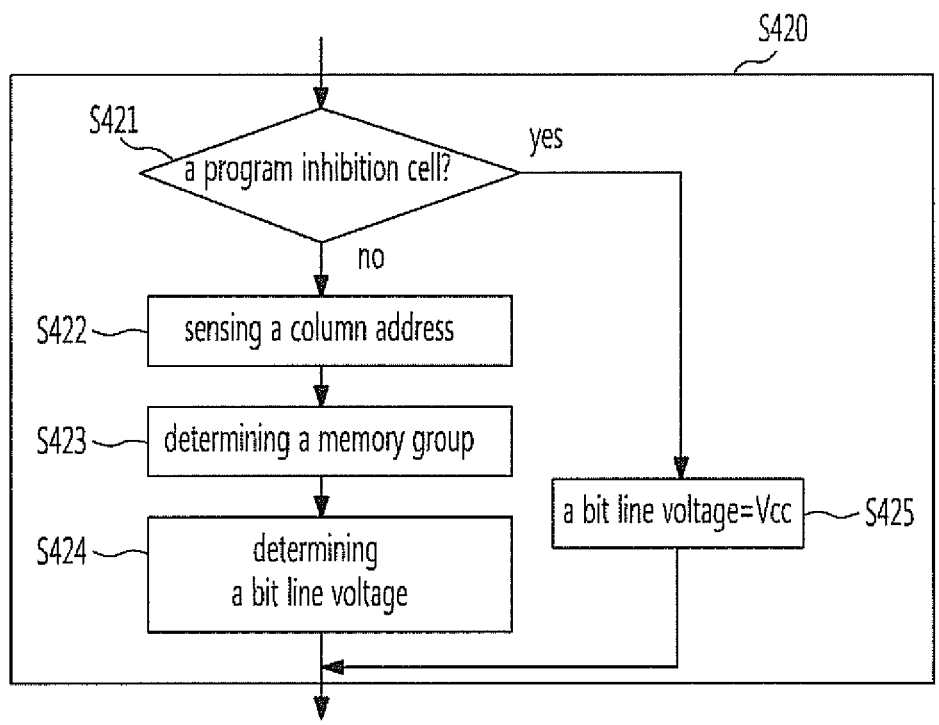

FIGS. 4 and 5 are flowcharts illustrating operation of a semiconductor memory device according to an exemplary embodiment of the present invention.

In FIG. 4, first word line is selected for the program operation in a step S410. In the step S410, data to be stored in memory cells connected to the first word line is latched in the page buffers. A program target cell and a program inhibition cell are determined from the memory cells connected to the first word line according to the data latched in the page buffers.

In a step S420, voltage level of the bit line connected electrically to each of the memory cells connected to the first word line is determined.

Referring to FIG. 5, it is verified whether or not the memory cell is a program inhibition cell in a step S421.

In a step S422, if the memory cell is a program target cell, not the program inhibition cell, a column address is sensed to verify the memory group including the memory cell. The column address may be sensed by the control circuit (120 in FIG. 1).

The memory group including corresponding memory cell is determined after the column address is sensed in a step S423, a bit line voltage of the memory group including the memory cell is applied to the bit line connected electrically to the memory cell in a step S424. The embodiment applies different voltages to the bit line connected electrically to the program target cell of the memory cells included in each memory group according to distances between the row decoder 140 shown in FIG. 1 and each of the memory groups.

In a case when the memory cell is the program inhibition cell according to the step S421, a program inhibition voltage, e.g., Vcc, is applied to the bit line in a step S425.

In a case when the bit line voltage of each of the memory cells connected to a word line selected in the step S420 is determined, a program loop is performed to store data in memory cells of first word line in step S430. In a case when the program loop is performed through an incremental step pulse program ISPP method, it includes a program operation, a program verifying operation, and a program voltage changing operation.

In a step S431, the program operation is performed to increase threshold voltage of selected memory cells according to the data latched in the page buffer.

Referring to FIG. 3, programmed data in the memory cell is inputted from the column select circuit 160 in FIG. 1 to the latch LAT2 of the second latch circuit LC2 in the page buffer. The threshold voltage of the memory cell increases in a case when program target data '0' is stored in the latch LAT2. The threshold voltage is maintained without changed in case that program inhibition data '1' is stored. Since the program voltage is applied to every memory cell C01 to C0k connected to the first word line, e.g., WL0, for the program operation, channel area of the program inhibition cell should be precharged before applying the pass voltage Vpass and the program voltage Vpgm so that the threshold voltage of the program inhibition cell is not changed. To precharge the channel area of the program inhibition cell, the program inhibition voltage, e.g., Vcc, is applied to the bit line connected electrically to the program inhibition cell as described in the step S421.

In a case when the program inhibition data '1' is stored in the latch LAT2, the second node QB[2] of the latch LAT2 has high level. Here, in a case when the second node QB[2] is connected to the sensing node SO according to the inverse transmission signal TRANM_N and the connection signal PBSENSE is inputted, the sensing node SO is connected to the bit line BL. Accordingly, the program inhibition voltage is delivered to the bit line BL.

A program allowable voltage, e.g., 0V, is applied to the bit line of the memory cell where the program target data '0' is stored. The channel area of the memory cell is discharged. In an embodiment, the program allowable voltage as the reference voltage is applied to the bit line of the memory cell.

In a case when the program target data '0' is stored in the latch LAT2, the first node QA[2] of the latch LAT2 has high level. Here, the reference voltage terminal is connected to the sensing node SO, according as the first latch input signal TRANTOT and the first latch data transmission signal TRANT are inputted. When the connection signal PBSENSE is inputted, the sensing node SO is connected to the bit line BL. Then, the reference voltage as the program allowable voltage is delivered to the bit line.

Subsequently, the pass voltage Vpass is applied to the word lines WL0 to WLn. As a result, a channel voltage increases to a boosting level in a channel area of the program inhibition cell due to capacitive coupling phenomenon.

After the channel voltage of the program inhibition cell increases to the boosting level, the program voltage Vpgm is applied to the selected word line WL0. Since difference of the channel voltage and the program voltage of the program target cell is high, electrons are injected into a floating gate of the program target cell. The threshold voltage of the program target cell increases. However, since a difference of the channel voltage and the program voltage of the program inhibition cell is small, electrons are not injected into a floating gate of the program inhibition cell. Then, threshold voltage of the program inhibition cell is not changed.

Since a higher reference voltage is applied to the bit line connected electrically to the program target cell included in corresponding memory group according as a distance between the row decoder and the memory group is short, a difference of program voltage provided to the program target cell and the channel voltage becomes small. Thus, a phenomenon, which programed data of the memory cells are distorted according to loading of the word line, may be prevented. Threshold voltage distribution of the memory cells may not become wide. That is, the embodiment may reduce a range of the threshold voltage distribution of the memory cells.

In a step S433, it is verified whether or not the threshold voltage of the memory cell increases to a target voltage. A program verifying operation is performed to determine whether or not the program operation is completed. Since the program verifying operation is well known to people skilled in the art, any further detailed description concerning the program verifying operation is omitted.

When the threshold voltage of the memory cell does not increase to the target level, a program voltage increases by a step voltage in a step S435. The program operation and the program verifying operation in the steps S431 and S433 are performed again. Herein, the program loop S430 is repeatedly performed until the threshold voltage of the memory cell increases to the target level.

If the threshold voltage of the memory cell increases to the target level, it is verified whether or not the word line corresponding to the program loop is final word line in a step S440. In a case where the word line is not final word line in the memory block, next word line is selected in a step S450. Then, the steps S420, S430, S440, and S450 are repetitively performed until the final word line is selected.

As described above, the memory blocks including the memory cells are divided into the memory groups. The bit line voltage applied to the bit line connected electrically to the memory cells included in each of the memory group is different according to the distance between the row decoder and each of the memory groups in the program operation. Thus, characteristics of the threshold voltage distribution of the memory cells may be enhanced without deteriorating the performance of the program.

The voltage applied to the bit line is different in accordance with the data stored in the page buffer. However, the voltage may be varied by precharging the sensing node SO through the precharge circuit P201 shown in FIG. 3 and changing a potential of the connection signal PBSENSE. Here, the control circuit 120 shown in FIG. 1 changes the potential of the connection signal PBSENSE and outputs the changed connection signal PBSENSE.

Figure 6:
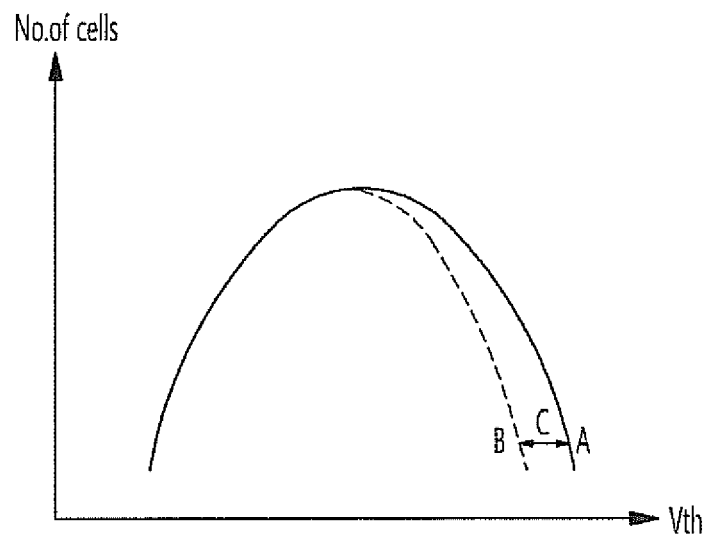
FIG. 6 is a view illustrating threshold voltage distribution of memory cells when a program operation is performed according to operation method of a semiconductor memory device of the present invention and threshold voltage distribution of memory cells when a program operation is performed in accordance with operation method of a conventional semiconductor memory device.

FIG. 6 is a view illustrating different threshold voltage distributions of memory cells when program operations are performed based on operation methods according to an embodiment of the present invention and a conventional semiconductor memory device.

'A' shows threshold voltage distribution of the memory cells after the program operation is performed according to the operation method of the conventional semiconductor memory device. 'B' illustrates the threshold voltage of the memory cells in accordance with the operation method of the semiconductor memory device of the present invention. 'C' shows difference between A and B.

In FIG. 6, a range of the threshold voltage distribution of the memory cells in the semiconductor memory device according to the embodiment is narrow, as compared with that of the memory cells in the conventional semiconductor memory device. The operation method according to the embodiment may improve characteristics of the threshold voltage distribution of the memory cells.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
   a memory block having memory groups, each including cell strings coupled to word lines;
   a row decoder configured to apply a program voltage to a selected word line during a program operation; and
   a bit line voltage supply circuit configured to apply different bit line voltages into bit lines coupled to program target cells of the selected word line using different reference voltages,
   wherein levels of the reference voltages vary according to a distance between the row decoder and the memory groups including the program target cell, and
   wherein levels of the bit line voltages vary according to the distance between the row decoder and the memory groups including the program target cell.

2. The semiconductor memory device of claim 1, wherein the bit line voltage supply circuit is configured to apply a program inhibition voltage to a bit line coupled to a program inhibition cell among the memory cells.

3. The semiconductor memory device of claim 1, wherein the bit line voltage supply circuit is configured to apply a voltage for discharging the bit line to the bit line coupled to the program target cell included in the memory group having the highest distance from the row decoder.

4. The semiconductor memory device of claim 1, wherein the bit line voltage supply circuit is configured to apply the voltage having a higher magnitude to the bit line coupled to the program target cell according as a distance between the row decoder and the memory group including the program target cell is small.

5. A semiconductor memory device comprising:
   a memory block having memory groups, each including cell strings coupled to word lines;
   a row decoder configured to apply a program voltage to a selected word line among the word lines during a program operation;
   page buffer groups including page buffers for applying different reference voltages to bit lines coupled to program target cells of the selected word line; and
   a reference voltage supply circuit configured to provide the reference voltages to the page buffer groups corresponding to the memory groups,
   wherein levels of the reference voltages vary according to a distance between the row decoder and the memory group including the program target cell.

6. The semiconductor memory device of claim 5, wherein the page buffer includes:
   a latch for storing the input data temporarily; and
   a reference voltage transfer circuit for applying the reference voltage to the bit line according to the input data.

7. The semiconductor memory device of claim 6, wherein the reference voltage transfer circuit is configured to apply the reference voltage to the bit line coupled to the program target cell, while providing a program inhibition voltage to a bit line coupled to a program inhibition cell according to the input data.

8. The semiconductor memory device of claim 5, wherein the reference voltage supply circuit is configured to apply a voltage, discharging the bit line coupled to the program target cell included in the memory group, to a page buffer group corresponding to a memory group having the highest distance from the row decoder among the memory groups.

9. The semiconductor memory device of claim 5, wherein the reference voltage supply circuit is configured to apply the reference voltage having a higher magnitude to a page buffer group corresponding to the memory group including the program target cell according as a distance between the row decoder and the memory group is small.

10. A method of operating a semiconductor memory device, the method comprising:

applying a first voltage to a bit line coupled to a program target cell of a first memory group coupled to a selected word line using a first reference voltage;

applying a second voltage, different from the first voltage, to a bit line coupled to another program target cell of a second memory group coupled to the selected word line using a second reference voltage, different from the first reference voltage; and performing a program operation of storing data in memory cells of the first and the second memory groups by providing a program voltage to the selected word line and applying a pass voltage to other word lines from a row decoder, wherein the first reference voltage varies according to a distance between the row decoder and the first memory group, and the second reference voltage varies according to a distance between the row decoder and the second memory group.

11. The method of claim 10, further comprising: applying a program inhibition voltage to a bit line coupled to a program inhibition cell among the memory cells coupled to the selected word line.

12. The method of claim 10, wherein the first voltage higher than the second voltage is applied to the bit line coupled to the program target cell, if a distance between the row decoder and the first memory group is smaller than that between the row decoder and the second memory group.

* * * * *